Figure 1:
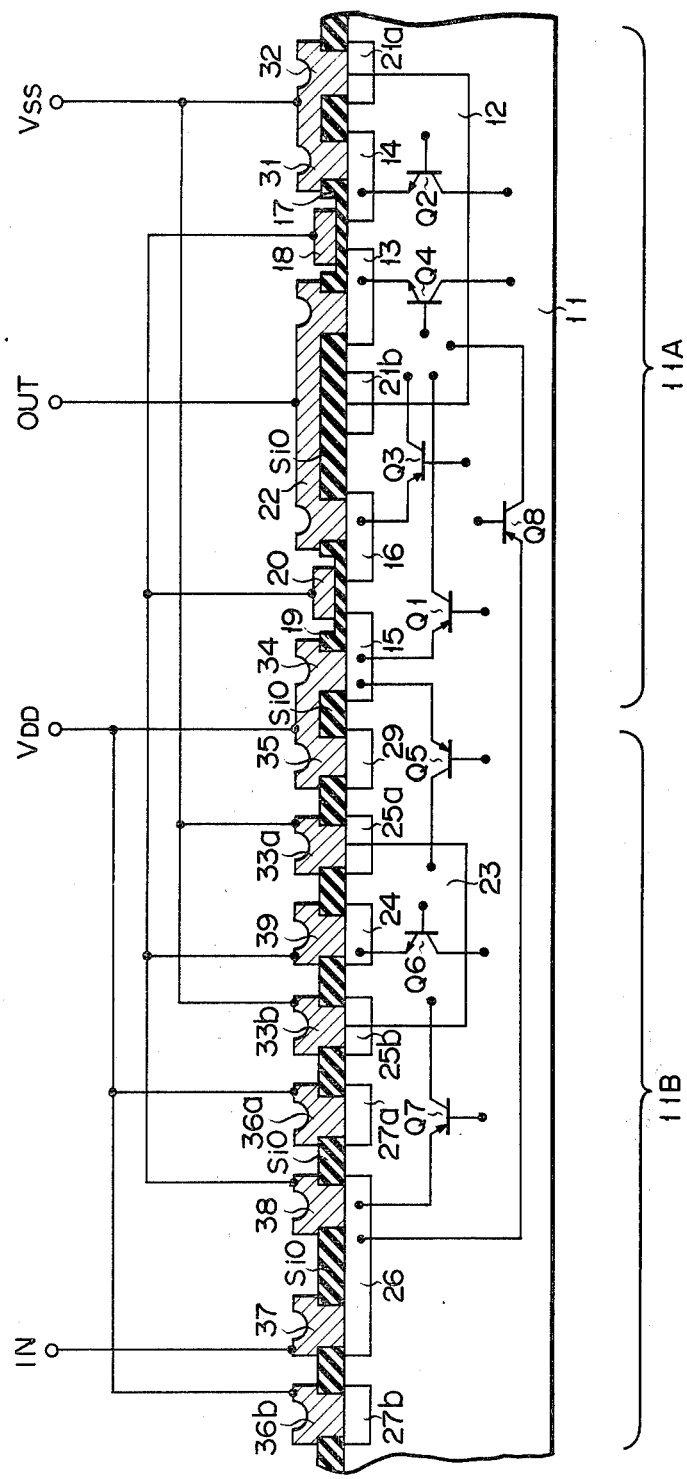

United States Patent [19]

Suzuki et al.

[11] 4,143,391
[45] Mar. 6, 1979

[54] INTEGRATED CIRCUIT DEVICE

[75] Inventors: Yasoji Suzuki, Ayase; Tomohisa Shigematsu, Yokohama, both of Japan

[73] Assignee: Tokyo Shibaura Electric Co., Ltd., Kawasaki, Japan

[21] Appl. No.: 917,176

[22] Filed: Jun. 20, 1978

Related U.S. Application Data

[63] Continuation of Ser. No. 722,101, Sep. 10, 1976, abandoned.

[30] Foreign Application Priority Data

Sep. 12, 1975 [JP] Japan .................................. 50-109940

[51] Int. Cl.² ........................................... H01L 27/02
[52] U.S. Cl. ........................................ 357/44; 357/42; 357/43; 357/46; 357/51; 357/55
[58] Field of Search ...................... 357/42, 43, 44, 46, 357/51, 55

[56] References Cited

U.S. PATENT DOCUMENTS

| | | | |
|---|---|---|---|
| 3,934,159 | 1/1976 | Nomiya et al. | 357/42 |
| 3,955,210 | 5/1976 | Bhatia et al. | 357/42 |

OTHER PUBLICATIONS

RCA – Tech. Notes – No. 876 – Feb. 1971 – Dennehy.

*Primary Examiner*—Edward J. Wojciechowicz
*Attorney, Agent, or Firm*—Finnegan, Henderson, Farabow & Garrett

[57] ABSTRACT

An integrated circuit device includes complementary MOS circuit elements formed in an N type semiconductor substrate with a P type region formed in the substrate. Protective circuit elements connected to an input terminal are formed in an area of the substrate other than the region thereof having the complementary MOS circuit elements formed therein. At least one of the regions constituting the protective circuit elements is formed in a P type additional region formed in the area of the N type substrate.

4 Claims, 2 Drawing Figures

INTEGRATED CIRCUIT DEVICE

This is a continuation of application Ser. No. 722,101, filed Sept. 10, 1976 now abandoned.

This invention relates to a semiconductor integrated circuit device capable of preventing the occurrence of a latch-up phenomenon peculiar to a Complementary Metal Oxide Semiconductor circuit.

Various kinds of circuits, which are each constituted by Complementary Metal Oxide Semiconductor (C-MOS) devices, are conventionally known and include a C-MOS inverter circuit as a typical example. As is known, a C-MOS inverter circuit is comprised of a P channel MOS transistor and an N channel MOS transistor and the threshold voltage of the former transistor has characteristics opposite to those of the threshold voltage of the latter transistor. Upon receipt of an input signal, therefore, only either one of the P channel MOS transistor and the N channel MOS transistor is rendered "on," so that no current flows between power source terminals of the C-MOS inverter circuit, and as a result this circuit is subject to very low power consumption. Namely, only three types of currents (1) a transient current instantaneously flowing in the C-MOS inverter circuit when both of the C-MOS transistors are simultaneously made "on" during the transient period of input information pulse (2) leak current produced in the pn junction, and (3) current flowing in the C-MOS inverter circuit when a load capacitance connected to the output terminal is subject to charge or discharge constitute the power consumption of the C-MOS inverter circuit.

In the above-mentioned C-MOS circuit, however, even if, noise is impulsively applied to the output, input or power supply section, an abnormal large direct current of scores of, or hundreds of, milliamperes flows between the power source terminals of the C-MOS circuit and thereafter the noise is removed, the abnormal large current some times continues to indicate a stationary flow. Owing to the occurrence of this latch-up phenomenon or thyristor phenomenon, the C-MOS circuit entirely loses its merit of minimum power consumption and further the C-MOS circuit device is thermally damaged to degrade its reliability.

Accordingly, the object of the invention is to provide an integrated circuit device capable of preventing the occurrence of the above-mentioned latch-up phenomenon.

According to the invention, in a one area of a semiconductor substrate there is formed a main-well region having a conductivity type opposite to that of the semiconductor substrate. Complementary MOS circuit elements are formed in the one area of the semiconductor substrate and the main-well region, respectively. Load elements being connected to an input terminal are formed in the other area of the semiconductor substrate excluding the one region having the complementary circuit elements formed therein. At least one of the semiconductor regions constituting those load elements, respectively, is formed in an additional region of the opposite conductivity type to that of the semiconductor substrate, formed in said other region of the semiconductor substrate.

Figure 2:
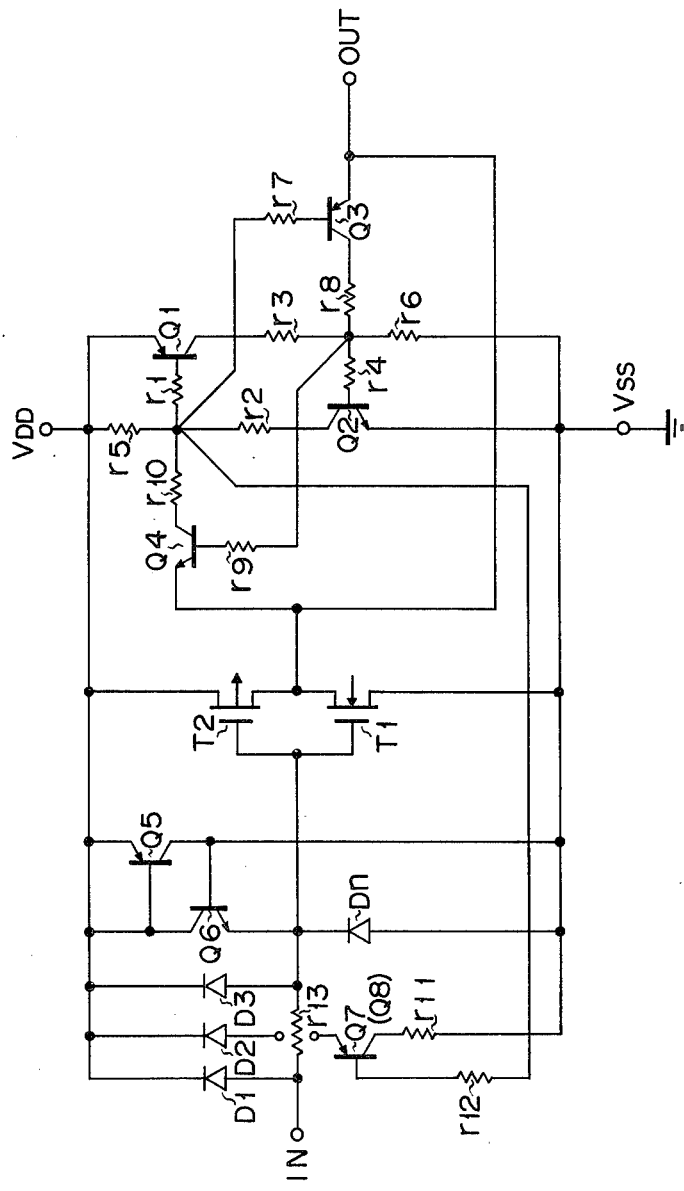

This invention can be more fully understood from the following detailed description when taken in conjunction with the accompanying drawings, in which:

FIG. 1 is a sectional view of an integrated circuit device according to an embodiment of the invention; and FIG. 2 is a circuit diagram showing the integrated circuit device of FIG. 1.

Referring to FIG. 1, an N type semiconductor substrate 11 has an impurity concentration of $1 \times 10^{15}$ atoms/cm$^3$. By diffusion of, for example, boron into the N type semiconductor substrate 11, a P type first region having an impurity concentration of about $2 \times 10^{16}$ atoms/cm$^3$, that is to say, a P-well region 12 is formed in the substrate 11. In this P-well region 12, N type second and third regions 13, 14 are formed, by diffusion, through windows formed in an oxide film SiO, so that they may be close to but not contacted with each other. In the periphery of the P-well region 12 are formed P type ohmic contact regions 21a, 21b each extended into both the P-well region 12 and the substrate 11. In an area 11A of the n type semiconductor substrate which is located approximate to the P-well region 12 P type fourth and fifth regions 15, 16 are formed, by diffusion, through windows formed in the oxide film SiO, so that they may be close to but not contacted with each other, a metal electrode 18 is deposited on an oxide film 17 formed on a channel between the N type second and third regions 13, 14. Similarly, a metal electrode 20 is deposited on an oxide film 19 formed on a channel between the regions 15, 16. With the metal electrode 18 used as a gate electrode the N type second and third regions 13, 14 and P-well region 12 constitute a N channel MOS transistor $T_1$, while the P type fourth and fifth regions 15, 16 and N type semiconductor substrate 11 constitutes an P channel MOS transistor $T_2$. The MOS transistors $T_1$, $T_2$ constitute a C-MOS circuit through the connection of the N type second region 13 (drain region) with the P type region 16 (drain region) by means of a metal layer 22 extending over the oxide film SiO from the region 13 to the region 16.

A P type seventh region 7, i.e., an additional P-well region 23 is formed, by diffusion, in an area 11B of the substrate 11 other than said area 11A having formed therein the above-mentioned C-MOS circuit. In this P-well region 23 an N type eighth region 24 is formed by diffusion through a window formed in the oxide film SiO. In the periphery of this P-well region 23, P type ninth regions 25a, 25b each extended into the substrate 11 and the P-well region 23 are formed, by diffusion through a window formed in the oxide film SiO. The ninth regions 25a, 25b act as an ohmic contact region. These N type eighth region and P type ninth regions constitute an input protective diode. In the area 11B of the substrate 11 a P type tenth region 26 for input protective resistance and diodes is formed spaced apart from the P-well region 23. In the surrounding area of the P type tenth region 26 an N type eleventh region 27a, 27b being connected to the bias terminal $V_{DD}$ is formed, by diffusion, through a window formed in the oxide film SiO, in such a manner as to be spaced apart from the tenth region 26. Further, in the substrate 11 an N type twelfth region 29 being connected to the bias terminal $V_{DD}$ is formed, by diffusion, through a window formed in the oxide film SiO, in such a manner as to be located closely to the P-well region 23.

The above-mentioned regions 14, 21a, 25a, and 25b are connected to the bias terminal $V_{SS}$ through electrodes 31, 32, 33a and 33b formed of metal layers deposited on those regions, respectively, while the regions 15, 29, 29a and 27b are connected to the bias terminal $V_{DD}$ through electrodes 34, 35, 36a and 36b formed of metal layers deposited on those regions, respectively. The input terminal IN is connected to an electrode 37 made of a metal layer formed on a portion of one side of the region 26. This electrode 37 is connected, through the region 26 and an electrode 38 made of a metal layer formed on a portion of the other side of the region 26, to an electrode 39 formed of a metal layer deposited on the region 24, the gate electrode 20 of the P channel MOS transistor $T_2$ and the gate electrode 18 of the N channel MOS transistor $T_1$. An output terminal OUT is connected to the metal layer 22 connecting the regions 13 and 16.

In the above-mentioned C-MOS circuit device, there are formed a lateral transistor $Q_1$ whose emitter, base and collector are constituted by the N type fourth region 15, N type semiconductor substrate 11 and P-well region 12, respectively, and a vertical transistor $Q_2$ whose emitter, base and collector are constituted by the N type third region 14, P type first region 12 and N type semiconductor substrate 11, respectively. Similarly, in the C-MOS circuit device, there are further formed a lateral transistor $Q_3$ whose emitter, base and collector are constituted by the P type fifth region 16, N type semiconductor substrate 11 and P-well region 12, respectively, and a vertical transistor $Q_4$ whose emitter, base and collector are constituted by the N type second region 13, P-well region 12 and N type semicondcutor substrate 11, respectively. Similarly, in the C-MOS circuit device, there are further formed a lateral transistor $Q_5$ whose emitter, base and collector are constituted by the P type fourth region 15, N type semiconductor substrate 11 and P-well region 23, respectively, and a vertical transistor $Q_6$ whose emitter, base and collector are constituted by the N type eighth region 24, P-well region 23 and N type semiconductor substrate 11, respectively. Similarly, in the C-MOS circuit device, there are further formed a lateral transistor $Q_7$ whose emitter, base and collector are constituted by the P type region 26, semiconductor substrate 11 and P-well region 23, respectively, and a vertical transistor $Q_8$ whose emitter, base and collector are constituted by the P type region 26, semiconductor substrate 11 and P-well region 12, respectively.

The C-MOS circuit device including the above-mentioned transistors $Q_1$ to $Q_8$ constitutes a circuit shown in FIG. 2. Referring to FIG. 2, the base of the transistor $Q_1$ is connected to the collector of the transistor $Q_2$ through diffusion resistors $r_1$, $r_2$, while the collector of the transistor $Q_1$ is connected to the base of the transistor $Q_2$ through diffusion resistors $r_3$, $r_4$. The emitters of the transistors $Q_1$ and $Q_2$ are connected to the bias terminal $V_{DD}$ and the terminal $V_{SS}$ grounded, respectively. The connection point between the diffusion resistors $r_1$ and $r_2$ is connected to the bias terminal $V_{DD}$ through a diffusion resistor $r_5$, while the connection point between the diffusion resistors $r_3$ and $r_4$ is grounded through a diffusion resistor $r_6$ and the terminal $V_{SS}$. The base and collector of the transistor $Q_3$ are connected to the $r_1$-to-$r_2$ connection point and to the $r_3$-to-$r_4$ connection point, respectively, through diffusion resistors $r_7$ and $r_8$, while the emitter of the transistor $Q_3$ is connected to the output terminal OUT. The base and collector of the transistor $Q_4$ are connected to the $r_3$-to-$r_4$ connection point and to the $r_1$-to-$r_2$ connection point, respectively, through diffusion resistors $r_9$ and $r_{10}$, while the emitter of the transistor $Q_4$ is connected to the output terminal OUT and also to the drain electrodes of transistors $T_1$ and $T_2$ of the C-MOS circuit connected cross the bias terminals $V_{DD}$ and $V_{SS}$. The base and collector of the transistor $Q_5$ are connected to the collector and base of the transistor $Q_6$, respectively, and simultaneously connected also to the terminals $V_{DD}$ and $V_{SS}$, respectively, while the emitters of the transistors $Q_5$ and $Q_6$ are connected to the terminal $V_{DD}$ and a connection point between gate electrodes of the transistors $T_1$, $T_2$ of the C-MOS circuit, respectively. The base and collector of the transistor $Q_5$ are connected to the terminals $V_{DD}$ and $V_{SS}$, respectively, through the contact regions 29 and 25a, while the base and collector of the transistor $Q_6$ are connected to the terminals $V_{SS}$ and $V_{DD}$, respectively, through the contact regions 25a and 29. Accordingly, both transistors $Q_5$ and $Q_6$ are connected to each other without having a diffusion resistor interposed between the base of the transistor $Q_5$ and the collector of the transistor $Q_6$ and between the collector of the transistor $Q_5$ and the base of the transistor $Q_6$. The collector of the transistor $Q_7$ (and $Q_8$) is connected to the terminal $V_{SS}$ through a diffusion resistor $r_{11}$, while the base thereof is connected to the $r_1$-to-$r_2$ connection point through a diffusion resistor $r_{12}$. The emitter of the transistor $Q_7$ (and $Q_8$) is connected to the connection point between the gate electrodes of the transistors $T_1$, $T_2$ of the C-MOS circuit through part of a diffusion resistor $r_{13}$ of the region 26. Further, a protective diode $D_n$ is reversely connected between that connection point and the terminal $V_{SS}$, and input protective diodes $D_1$, $D_2$ and $D_3$ are reversely connected between the terminal $V_{DD}$ and an input terminal IN directly through the whole or part of the diffusion resistor $r_{13}$.

In the C-MOS circuit device of FIG. 1 having the circuit construction shown in FIG. 2, the diodes $D_1$, $D_2$, $D_3$ and $D_n$ and the transistors $Q_5$, $Q_6$, $Q_7$ and $Q_8$ constitute an input protective diode circuit, and the transistors $Q_5$, $Q_6$, $Q_7$ and $Q_8$ of this diode circuit are formed in the C-MOS circuit and are separated from a thyristor circuit comprised of the transistors $Q_1$ to $Q_4$. But, the transistors $Q_7$ and $Q_8$ are not completely separated from the thyristor circuit in the C-MOS circuit. Since, however, the transistors $Q_7$ and $Q_8$ are lateral transistors, their current amplification factor $\beta$ is only one part in several tens or several hundreds of that of the vertical transistor. Besides, if the length of that substrate portion constituting the base region of the transistor $Q_8$ which is defined between the P type region 26 and the P well region 12 as well as the length of that substrate portion constituting the base region of the transistor $Q_7$ which is defined between the P type region and the P-well region 23 is chosen to be sufficiently large, the current amplification factor $\beta$ will be able to be made nearly zero. Accordingly, if, upon effecting the pattern designing in manufacturing the C-MOS circuit device, the pattern designing is so performed as the permit the base regions of the transistors $Q_7$ and $Q_8$ to have a larger length, the transistors $Q_7$, $Q_8$ will become negligible. It follows, from this, that a thyristor circuit formed in the input protective circuit is completely separated from the thyristor circuit in the C-MOS circuit. Further, according to this C-MOS circuit device, as above stated, no resistor is provided for the respective bases and collectors of the transistors $Q_5$, $Q_6$ of the thyristor circuit in the input protective circuit. As will be understood from the above description, therefore, even if a noise of, for example, $-6$ volts is supplied to the input terminal IN to render the transistor $Q_6$ "on," the base potential of the transistor $Q_5$ will not decrease on account of the absence of a resistor at the base of the transistor $Q_5$, so that the transistor $Q_5$ will be kept in an off-state. That is to say, since the transistor $Q_5$ is not made "on" even when the transistor $Q_6$ is made "on," the thyristor circuit in the input protective circuit is not subject to occurrence of a latch-up phenomenon. Further, in the case where the input terminal IN is supplied with a positive-level noise, the occurrence of a latch-up phenomenon due to this positive-level noise can be prevented if the base region of the transistors $Q_7$, $Q_8$ is formed to a large length so as to make sufficiently low the current amplification factor $\beta$ of the transistors $Q_7$, $Q_8$.

If, in this way, the input protective circuit is formed in that area of the semiconductor substrate which is different from the area thereof where the C-MOS circuit is formed and is simultaneously so formed that the regions for forming therein that input protective circuit and being connected to the bias terminals $V_{DD}$, $V_{SS}$ may be electrically completely contacted with these terminals $V_{DD}$, $V_{SS}$, respectively, namely connected thereto without having any resistor interposed between both, the occurrence of a latch-up phenomenon will be able to be sufficiently prevented.

Note that the foregoing "latch-up roof" semiconductor structure is not limited to the input side but can be applied also to the output side. Namely, if, in the case of, for example, LSI, an output buffer is not formed in the semiconductor regions for forming an internal FET but in a region separate from any of these regions and simultaneously is sufficiently applied with a bias voltage, the effect of the invention will be obtained also with respect to the output side of the semiconductor device.

What we claim is:

1. An integrated circuit device having an input terminal and formed in a semiconductor substrate of a first conductivity type comprising: a first semiconductor section in said semiconductor substrate in which there is formed a first well region having a second conductivity type opposite to said first conductivity type, complementary MOS elements formed in said first semiconductor section, one inside and one outside said first well region, said MOS elements each having a gate; a second semiconductor section in said semiconductor substrate physically separated from said first semiconductor section, in which there is formed a second well region having said second conductivity type; a first region of said first conductivity type located in said second well region to form a first protective diode between said first region and said second well region and said first region being coupled to said gates of said MOS elements; said second semiconductor section further including a second region of said second conductivity type formed in said substrate and forming a protective input resistance between first and second portions of said second region, said first portion connected to said input terminal and said second portion connected to said gates of said MOS elements and said second region further forming additional protective diodes between said second region and said second semiconductor section, said second region and said second well region both spaced sufficiently wide apart in said second semiconductor section from each other and from said first semiconductor section to prevent the occurrence of a latch-up phenomenon due to the action of lateral parasitic transistors between said first and second semiconductor sections.

2. An integrated circuit device according to claim 1, wherein at least one ohmic-contact region of said second conductivity type is formed in a periphery portion of said second well region and extends into said substrate and second well region for connecting said second well region to a predetermined potential source.

3. An integrated circuit device according to claim 1, wherein at least one ohmic-contact region of said first conductivity type is formed in said substrate and spaced from a periphery portion of said second well region for connecting the substrate which surrounds said second well region to a bias voltage source.

4. An integrated circuit device according to claim 1, wherein at least one ohmic-contact region of said second conductivity type is formed in a periphery portion of said first well region and extends into said substrate and said first well region for connecting said first well region to a predetermined potential source.

* * * * *